US006765355B2

(12) United States Patent
Matsumoto et al.

(10) Patent No.: US 6,765,355 B2
(45) Date of Patent: Jul. 20, 2004

(54) APPARATUS FOR LIGHTING A DISCHARGE LAMP AT ELECTRIC CHARACTERISTICS APPROPRIATE TO A TYPE OF THE DISCHARGE LAMP (75) Inventors: Katsunori Matsumoto, Tokyo (JP); Takashi Ohsawa, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/359,220

(22) Filed: Feb. 6, 2003

(65) Prior Publication Data

US 2003/0160578 A1 Aug. 28, 2003

(30) Foreign Application Priority Data

Feb. 22, 2002 (JP) ........................................ 2002-046612

(51) Int. Cl.[7] ............................................. H05B 37/02
(52) U.S. Cl. ...................... 315/307; 315/224; 315/276
(58) Field of Search ................................. 315/307, 308, 315/313, 224, 276, 291, 209 R (56) References Cited

U.S. PATENT DOCUMENTS 6,693,393 B2 * 2/2004 Konishi et al. ............. 315/224

FOREIGN PATENT DOCUMENTS

| JP | 4-342988 | 11/1992 |
| JP | 2001-210490 | 8/2001 |

* cited by examiner

Primary Examiner—Don Wong
Assistant Examiner—Trinh Vo Dinh
(74) Attorney, Agent, or Firm—Sughrue Mion PLLC (57) ABSTRACT

Electric characteristics such as a change of an electric power, a change of a voltage and a change of a current supplied from a discharge lamp lighting apparatus to a discharge lamp from a lighting start time to a stable lighting time are detected in a preceding lighting operation and is stored in a storage circuit. In a present lighting operation, a type of the discharge lamp is detected in a control circuit according to the electric characteristics of the preceding lighting operation, a duty ratio of a control signal supplied to a switching transistor is controlled by the control circuit to produce a typical electric power of typical electric characteristics appropriate to the judged type of the discharge lamp in the discharge lamp lighting apparatus and to light the discharge lamp according to the typical electric power of the typical electric characteristic.

12 Claims, 5 Drawing Sheets

APPARATUS FOR LIGHTING A DISCHARGE LAMP AT ELECTRIC CHARACTERISTICS APPROPRIATE TO A TYPE OF THE DISCHARGE LAMP

BACKGROUND OF THE INVENTION

1. Field of the Invention

The present invention relates to a discharge lamp lighting apparatus in which a discharge lamp is lighted according to electric characteristics appropriate to a type of the discharge lamp.

2. Description of Related Art

There are many types of high intensity discharge (HID) bulbs such as a D1 bulb, a D2 bulb, a D3 bulb and a D4 bulb representing a plurality of types of discharge lamps. In both the D1 bulb and the D2 bulb, mercury is packed in a discharge tube. Because mercury exists as liquid mercury at ordinary temperatures, mercury is rapidly evaporated in the discharge tube, almost white light radiates from the discharge tube, and a voltage between electrodes of the discharge tube is stably maintained to a comparatively high temperature during the lighting of the discharge tube.

However, because the use of mercury causes environmental problems, the use of mercury is suppressed, and both the D3 bulb and the D4 bulb not using mercury have been developed. In both the D3 bulb and the D4 bulb, metal different from mercury is substituted for mercury, and the substitutive metal exists as solid metal at ordinary temperatures. However, a discharge voltage in an discharge tube having the substitutive metal is lowered, and a high electric power is required to evaporate the substitutive metal in the discharge tube. In this case, a high electric power is required to rapidly light the D3 bulb or the D4 bulb.

Therefore, electric characteristics of both the D1 bulb and the D2 bulb in the lighting differ from those of both the D3 bulb and the D4 bulb. In cases where a conventional discharge lamp lighting apparatus is used to light various types of bulbs at the same luminous characteristics regardless of the difference in the electric characteristics between the D1/D2 bulb and the D3/D4 bulb, it is required that both an electric power supplied to the D1/D2 bulb and another electric power supplied to the D3/D4 bulb are prepared in the conventional discharge lamp lighting apparatus and one of the electric powers is selected in the conventional discharge lamp lighting apparatus in compliance with the type of the bulb connected to the conventional discharge lamp lighting apparatus. Therefore, a problem has arisen that it is troublesome to manually select one of the electric powers in the conventional discharge lamp lighting apparatus.

Also, a discharge lamp lighting device is disclosed in the Published Unexamined Japanese Patent Application No. 2001-210490. In this device, to light each of a plural kinds of discharge lamps with characteristics appropriate to the type of discharge lamp, a type of the discharge lamp connected to the device is specified according to a change of voltage or a change of current during a selecting time period at an initial stage of power supply or according to values obtained after the selecting time period, and an electric power appropriate to the specified type of the discharge lamp is supplied to the discharge lamp. However, a problem has arisen that an electric power appropriate to the type of the discharge lamp connected to the device cannot be supplied to the discharge lamp at the start of the lighting of the discharge lamp. Therefore, a life time of the discharge lamp is shortened, or the discharge lamp cannot be rapidly lighted at high luminance.

Also, another discharge lamp lighting device is disclosed in the Published Unexamined Japanese Patent Application No. H4-342988 (1992). In general, a discharge lamp is used so as to be lighted just after the putting out of the discharge lamp. Because the discharge lamp put out is maintained to a high temperature for a time, this lighting is called a hot start. Also, another discharge lamp is used so as to be lighted when the discharge lamp is set to a low temperature. This lighting is called a cold start. In this case, even though two discharge lamps are formed of the same type, characteristics of one discharge lamp operated at the hot start slightly differ from that operated at the cold start. Also, even though a plurality of discharge lamps of the same type are manufactured, characteristics of each discharge lamp slightly differ from those of the other discharge lamps due to the difference in manufacturing conditions or secular change. Therefore, when each of the discharge lamps formed of the same type is lighted by using a general discharge lamp lighting device, the light flux of one discharge lamp is slightly overshot or undershot, the life time of the discharge lamp is shortened, or the discharge lamp cannot be rapidly lighted at high luminance. To prevent this problem, in the discharge lamp lighting device of the Application No. H4-342988, characteristics of a discharge lamp lighted in a previous run are stored, and an electric power supplied to the discharge lamp in a current run is determined in the discharge lamp lighting device according to the stored electric characteristics to control the lighting of the discharge lamp. Therefore, one type of discharge lamps set to the same rated condition can be appropriately operated. However, in a case where one type of discharge lamp set to a rated condition is replaced with another type of discharge lamp which is set to a considerably different rated condition and required a considerably different electric power, a problem has arisen that an electric power appropriate to a type of a discharge lamp connected to the device cannot be always supplied to the discharge lamp.

SUMMARY OF THE INVENTION

An object of the present invention is to provide, with due consideration to the drawbacks of the conventional discharge lamp lighting apparatus, a discharge lamp lighting apparatus in which any type of discharge lamp is efficiently lighted from the start of the lighting even though the type of discharge lamp is connected at present to the apparatus in place of another type of discharge lamp having electric characteristics different from those of the discharge lamp connected to the apparatus at present.

The object is achieved by the provision of a discharge lamp lighting apparatus including discharge lamp lighting means, electric characteristic detecting means, storing means and control means. An electric power is supplied to a discharge lamp by the discharge lamp lighting means. An electric characteristic of the electric power supplied to the discharge lamp in a preceding lighting operation is detected by the electric characteristic detecting means and is stored in the storing means. The control means judges a type of the discharge lamp according to the detected electric characteristic of the preceding lighting operation and controls the discharge lamp lighting means to produce a typical electric power of a typical electric characteristic appropriate to the judged type of the discharge lamp and to light the discharge lamp according to the typical electric power of the typical electric characteristic.

Therefore, even though a first discharge lamp is changed to a second discharge lamp of which a type and an electric characteristic differ from those of the first discharge lamp, the type of the second discharge lamp is judged according to the electric characteristic of the second discharge lamp in a preceding lighting operation, and the second discharge lamp is lighted from a lighting start time of a present lighting operation by receiving a typical electric power of a typical electric characteristic appropriate to the type of the second discharge lamp. Accordingly, the discharge lamp can be efficiently lighted from the start of the lighting even though the discharge lamp is connected at present to the discharge lamp lighting apparatus in place of another discharge lamp having different electric characteristics.

In another aspect of the present invention, a discharge lamp lighting apparatus includes a shape detecting means for detecting a shape of the discharge lamp discharge lamp lighting means. Therefore, a type of the discharge lamp can be judged according to a shape of the discharge lamp detected by the shape detecting means.

DETAILED DESCRIPTION OF THE PREFERRED EMBODIMENTS

Embodiments of the present invention will now be described with reference to the accompanying drawings.
Embodiment 1

Figure 1:
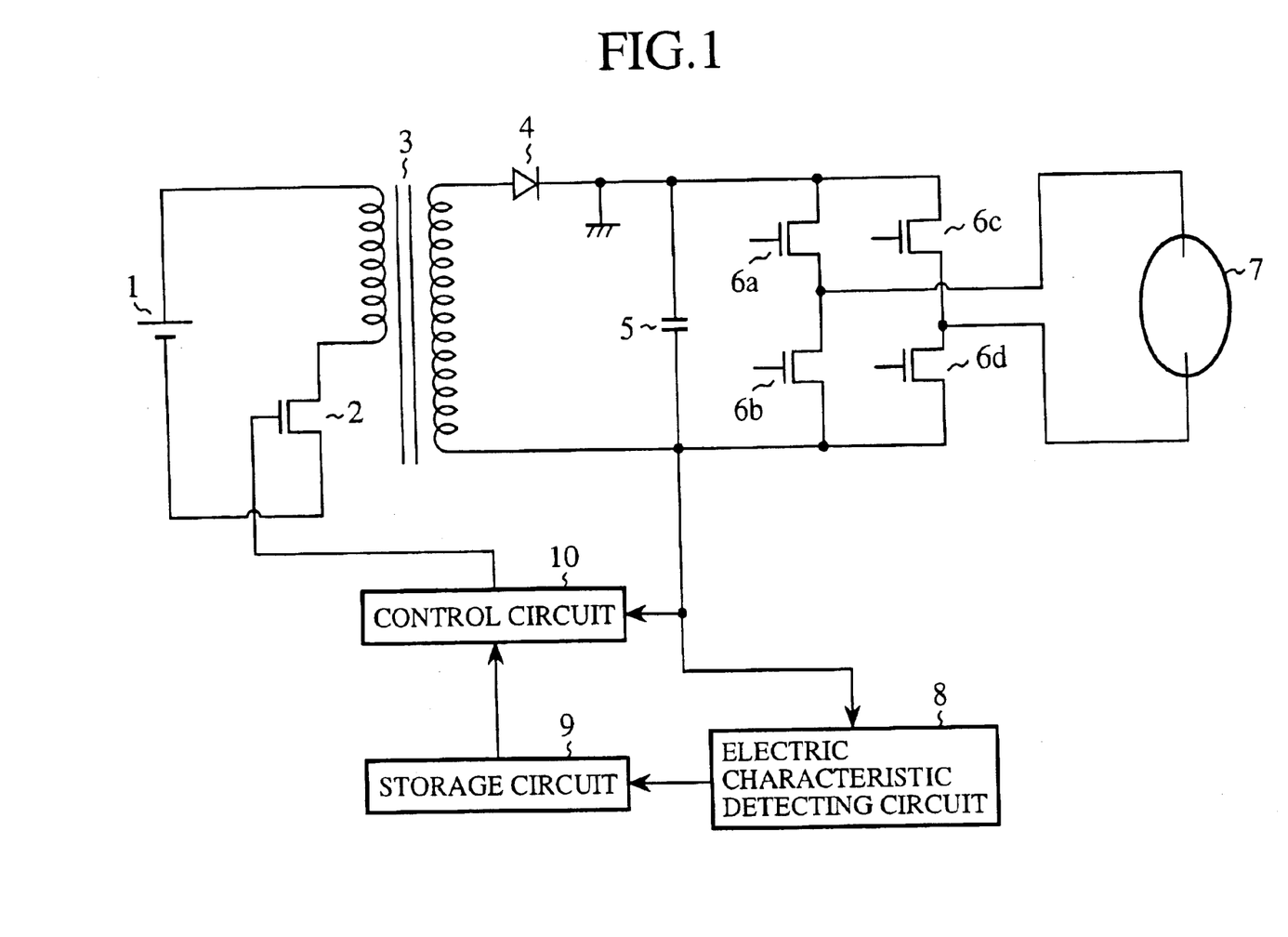
FIG. 1 is a circuit view showing a discharge lamp lighting apparatus according to a first embodiment of the present invention.
Figure 2A:
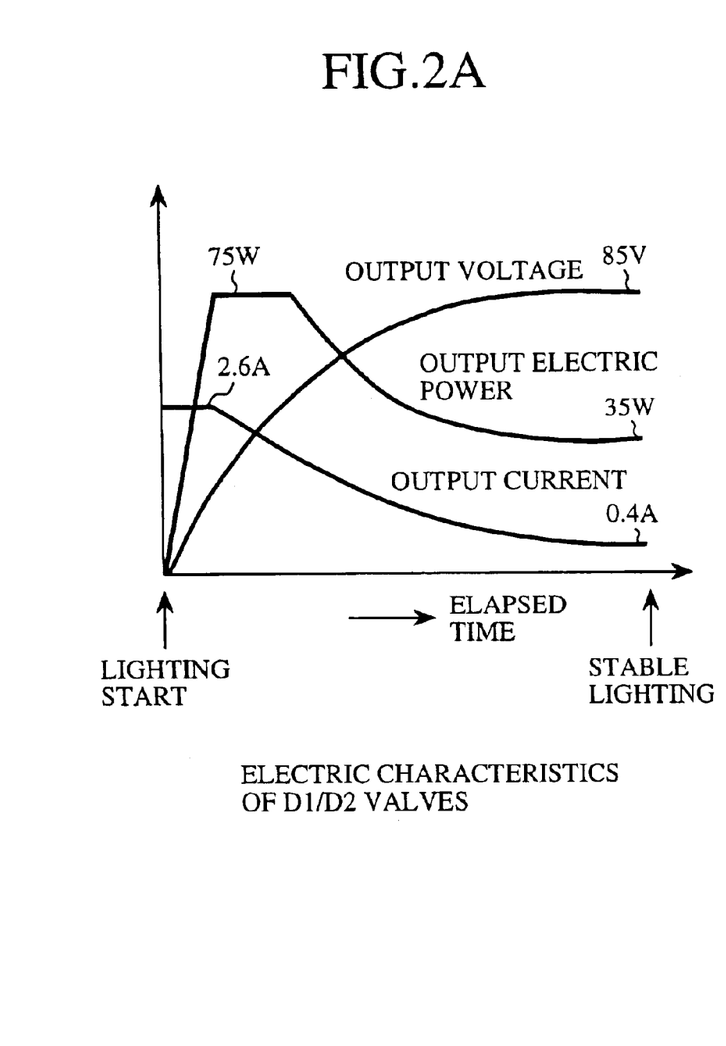
FIG. 2A is a characteristic view showing electric characteristics of a D1/D2 bulb.

FIG. 1 is a circuit view showing a discharge lamp lighting apparatus according to a first embodiment of the present invention. FIG. 2A is a characteristic view showing typical electric characteristics of a D1/D2 bulb, and FIG. 2B is a characteristic view showing typical electric characteristics of a D3/D4 bulb.

In FIG. 1, 1 indicates a direct-current power source (or rectangular-shaped current producing means of discharge lamp lighting means) for supplying a direct current. 2 indicates a switching transistor (or rectangular-shaped current producing means of discharge lamp lighting means) for changing the direct current supplied from the direct-current power source 1 to a rectangular-shaped current. The switching transistor 2 is, for example, formed of an n-channel metal oxide semiconductor (NMOS) transistor. 3 indicates a transformer (or power supplying means of discharge lamp lighting means) for heightening a voltage of the rectangular-shaped current obtained by the function of the switching transistor 2. 4 indicates a diode for rectifying the rectangular-shaped current of the high voltage set in the transformer 3. 5 indicates a condenser for accumulating the current rectified in the diode 4 to obtain an electric power of a high voltage. 7 indicates a high intensity discharge (HID) bulb (or a discharge lamp) lighted by receiving the electric power of the high voltage output from the condenser 5. The HID bulb 7 is formed of one D1 bulb, one D2 bulb, one D3 bulb or one D4 bulb representing a type of discharge lamp, and the type of the HID bulb 7 is changed according to the purpose of using the discharge lamp lighting apparatus. 6a and 6b indicate switching transistors placed in parallel to each other. 6c and 6d indicate switching transistors placed in parallel to each other. Each of the switching transistors 6a to 6d is, for example, formed of an NMOS transistor. The switching transistors 6a and 6b are placed in parallel to the condenser 5, and a connection point of the switching transistors 6a and 6b is connected to one terminal of the HID bulb 7. The switching transistors 6c and 6d are placed in parallel to the condenser 5, and a connection point of the switching transistors 6c and 6d is connected to the other terminal of the HID bulb 7. The path of the current supplied from the condenser 5 to the HID bulb 7 is changed in the switching transistors 6a to 6d to change the direction of the current flowing through the HID bulb 7.

8 indicates an electric characteristic detecting circuit (or electric characteristic detecting means) for detecting electric characteristics of the electric power output from the condenser 5 to the HID bulb 7 from the start of the lighting operation to a stable lighting time in a preceding lighting operation. The electric characteristics of the electric power denote a change of the electric power output to the HID bulb 7, a change of a voltage of the electric power and a change of a current of the electric power in a time period from the start of the lighting operation to a stable lighting time. In this case, it is applicable that a changing characteristic of the electric power, a changing characteristic of the voltage and a changing characteristic of the current at the start of the lighting operation or at the stable lighting time be detected as the electric characteristics of the electric power. Also, it is applicable that a change of the electric power, a change of the voltage or a change of the current in the time period from the start of the lighting operation to the stable lighting time be detected as the electric characteristics of the electric power.

Figure 2B:
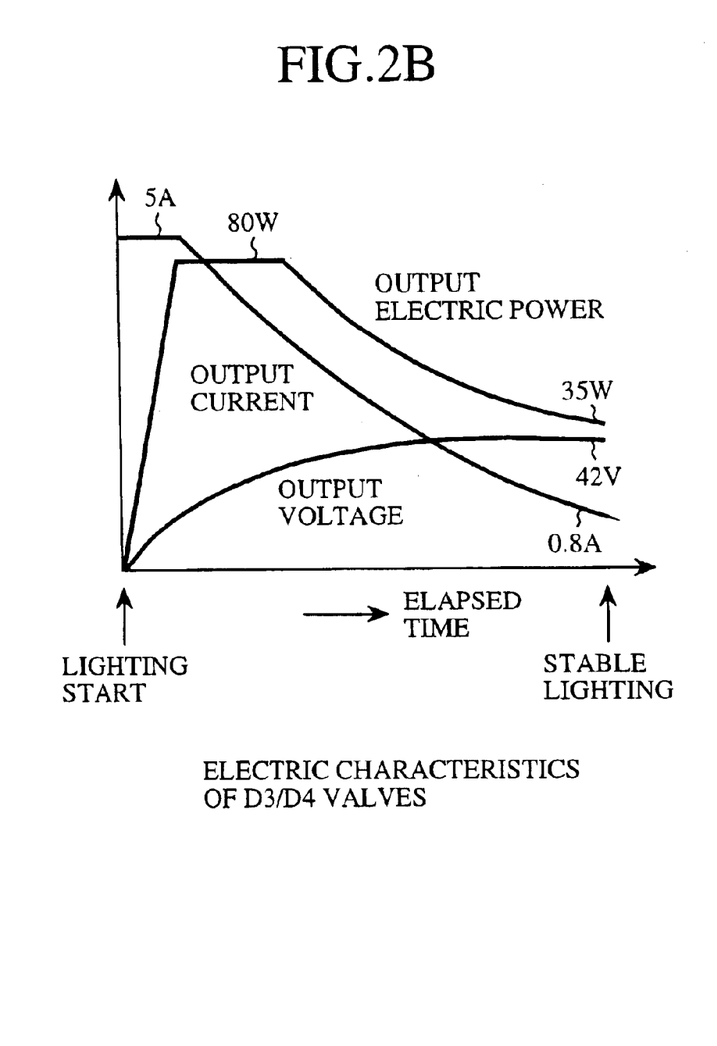
FIG. 2B is a characteristic view showing electric characteristics of a D3/D4 bulb.

9 indicates a storage circuit (or storing means) for storing the electric characteristics of the preceding lighting operation detected in the electric characteristic detecting circuit 8 as detected electric characteristics of the HID bulb 7, storing typical electric characteristics of the electric power appropriate to the D1/D2 bulb shown in FIG. 2A in advance and storing typical electric characteristics of the electric power appropriate to the D3/D4 bulb shown in FIG. 2B in advance. The storage circuit 9 is preferably formed of an electrically erasable/programmable read only memory (EEPROM). Also, it is applicable that the storage circuit 9 be formed of a random access memory (RAM) to which power is always supplied.

10 indicates a control circuit (or control means) for judging the type of the HID bulb 7 by comparing the detected electric characteristics of the preceding lighting operation stored in the storage circuit 10 with the typical electric characteristics appropriate to the D1/D2 bulb and the typical electric characteristics appropriate to the D3/D4 bulb stored in the storage circuit 10, setting a duty ratio (or a ratio of high level to low level) of a control signal sent to the switching transistor 2 to a lower duty ratio changing pattern corresponding to the D1/D2 bulb or a higher duty ratio changing pattern corresponding to the D3/D4 bulb to output an electric power of typical electric characteristics appropriate to the judged type of the HID bulb 7 from the condenser 5 to the HID bulb 7. In a case where the HID bulb 7 is formed of the D1 bulb or the D2 bulb, the electric power produced according to the lower duty ratio change pattern of the control signal is appropriate to the HID bulb 7. Also, in a case where the HID bulb 7 is formed of the D3 bulb or the D4 bulb, the electric power produced according to the higher duty ratio change pattern of the control signal is appropriate to the HID bulb 7.

Here, the specifications of D1, D2, D3 and D4 bulbs are described.

In the D1 bulb boarded on vehicle, normal consumed electric power is set to 35 W, bulb rated voltage is set to 85 V, maximum consumed electric power is set to 75 W, mercury is packed, and an igniter is used.

In the D2 bulb boarded on vehicle, normal consumed electric power is set to 35 W, bulb rated voltage is set to 85 V, maximum consumed electric power is set to 75 W, mercury is packed, and a connector is used.

In the D3 bulb boarded on vehicle, normal consumed electric power is set to 35 W, bulb rated voltage is set to 42 V, maximum consumed electric power is set to 80 W, no mercury is packed, and an igniter is used.

In the D4 bulb boarded on vehicle, normal consumed electric power is set to 35 W, bulb rated voltage is set to 42 V, maximum consumed electric power is set to 80 W, no mercury is packed, and a connector is used.

Next, an operation of the discharge lamp lighting apparatus will be described below.

In a case where it is intended to start the lighting of the HID bulb 7, a direct current supplied from the direct-current power source 1 is changed to a rectangular-shaped current by turning on and off the switching transistor 2 according to a control signal sent from the control circuit 10, a voltage of the rectangular-shaped current is heightened in the transformer 3, the rectangular-shaped current of a high voltage is rectified in the diode 4, and a rectified current of the high voltage is accumulated in the condenser 5. Also, the turning-on of both the switching transistors 6a and 6d and the turning-off of both the switching transistors 6b and 6c are performed in a first operation to supply the current of the high voltage from the condenser 5 to the HID bulb 7 in a first current direction through both the switching transistors 6a and 6d, and the turning-off of both the switching transistors 6a and 6d and the turning-on of both the switching transistors 6b and 6c are performed in a second operation to supply the current of the high voltage from the condenser 5 to the HID bulb 7 in a second current direction through both the switching transistors 6b and 6c. The first and second operations are alternately performed. Therefore, the lighting of the HID bulb 7 is started, and the HID bulb 7 is stably lighted after a prescribed time period.

Also, electric characteristics of the electric power supplied from the condenser 5 to the HID bulb 7 are detected in a preceding lighting operation in the electric characteristic detecting circuit 8. For example, a change of the electric power, a change of a voltage of the electric power and a change of a current of the electric power from the start of the lighting operation to a stable lighting time are detected. The detected electric characteristics are digitized to detected values in the electric characteristic detecting circuit 8, and the detected values are stored in the storage circuit 9. The detected values indicating the detected electric characteristics of the preceding lighting operation are stored in the storage circuit 9 just before a present lighting operation of the HID bulb 7. Therefore, in a case where the D1 bulb or the D2 bulb is used as the HID bulb 7, the detected electric characteristics similar to those shown in FIG. 2A are stored in the storage circuit 9. Also, in a case where the D3 bulb or the D4 bulb is used as the HID bulb 7, the detected electric characteristics similar to those shown in FIG. 2B are stored in the storage circuit 9.

In the control circuit 10, at the start of the present lighting operation, the detected electric characteristics of the electric power stored in the storage circuit 10 in the preceding lighting operation are compared with the typical electric characteristics appropriated to the D1/D2 bulb stored in the storage circuit 10 and also compared with the typical electric characteristics appropriated to the D3/D4 bulb stored in the storage circuit 10. Thereafter, in a case where the detected electric characteristics of the electric power are similar to the typical electric characteristics appropriated to the D1/D2 bulb, the type of the HID bulb 7 is judged to be the D1 bulb or the D2 bulb, and a duty ratio of the control signal is set to a lower duty ratio change pattern corresponding to the typical electric characteristics appropriated to the D1/D2 bulb. Also, in a case where the detected electric characteristics of the HID bulb 7 are similar to the typical electric characteristics appropriated to the D3/D4 bulb, the type of the HID bulb 7 is judged to be the D3 bulb or the D4 bulb, and a duty ratio of the control signal is set to a higher duty ratio change pattern corresponding to the typical electric characteristics appropriated to the D3/D4 bulb. Thereafter, the control signal set to the prescribed duty ratio change pattern is sent to the switching transistor 2 to output the electric power set to the typical electric characteristics appropriate to the judged type of the HID bulb 7 from the condenser 5 and to supply the electric power to the HID bulb 7. For example, when the control signal set to the lower duty ratio change pattern is sent to the switching transistor 2, the electric power output from the condenser 5 to the HID bulb 7 is immediately heightened to 75 W, is gradually decreased and reaches 35 W at the stable lighting time. The voltage applied from the condenser 5 to the HID bulb 7 is gradually increased and reaches 85 V at the stable lighting time. The current applied from the condenser 5 to the HID bulb 7 is immediately heightened to 2.5 A at the start of the lighting operation, is gradually decreased and reaches 0.4 A at the stable lighting time. Also, when the control signal set to the higher duty ratio change pattern is sent to the switching transistor 2, the electric power output from the condenser 5 to the HID bulb 7 is immediately heightened to 80 W, is gradually decreased and reaches 35 W at the stable lighting time. The voltage applied from the condenser 5 to the HID bulb 7 is gradually increased and reaches 42 V at the stable lighting time. The current applied from the condenser 5 to the HID bulb 7 is immediately heightened to 5 A at the start of the lighting operation, is gradually decreased and reaches 0.8 A at the stable lighting time.

Here, in a case where the HID bulb 7 is replaced with another HID bulb, the detected electric characteristics stored in the storage circuit 9 are deleted. Therefore, in a case no detected electric characteristic is stored in the storage circuit 9, the control circuit 10 judges at the start of the lighting operation that the HID bulb 7 is newly connected to the discharge lamp lighting apparatus and is lighted for the first time, the duty ratio of the control signal is set to the lower duty ratio change pattern corresponding to the maximum supplied electric power of 75 W required in the D1/D2 bulb, and the electric power set to the typical electric characteristics shown in FIG. 2A is supplied to the HID bulb 7. Therefore, no overshooting of light fluxes occurs in the HID bulb 7, and no excessive stress is given to the HID bulb 7. Accordingly, the life time of the HID bulb 7 is not shortened by excessive stress in the first lighting operation.

As is described above, in the first embodiment, even though a first HID bulb is replaced with a second HID bulb of the different type from that of the first HID bulb, the type of the second HID bulb is correctly judged at the start of the lighting operation of the present lighting operation according to the electric characteristics of the electric power supplied to the second HID bulb in the preceding lighting operation, and the lighting of the second HID bulb is controlled by the discharge lamp lighting apparatus to output an electric power set to the typical electric characteristics appropriate to the type of the second HID bulb from the condenser 5 and to supply the electric power to the second HID bulb. Accordingly, even though one HID bulb is replaced with another HIV bulb of the different type, the HID bulb can be efficiently lighted from the start of the lighting operation.

Here, there is a case where a long-used HID bulb is changed to a new HID bulb of the same type as that of the long-used HID bulb. In this case, the electric characteristics of the electric power supplied to the new HID bulb differ from those of the long-used HID bulb. However, in this case, because the difference of the electric characteristics is small as compared with the difference between the typical electric characteristics shown in FIG. 2A and the typical electric characteristics shown in FIG. 2B, the control signal for the new HID bulb is correctly set to the same duty ratio change pattern as that for the long-used HID bulb in the control circuit 10.

Also, when a plurality of HID bulbs of the same type are manufactured, electric characteristics of the HID bulbs differ from each other due to the difference in manufacturing conditions. However, the difference of the electric characteristics is small as compared with the difference between the typical electric characteristics shown in FIG. 2A and the typical electric characteristics shown in FIG. 2B. Therefore, even though any of the HID bulbs of the same type is connected to the discharge lamp lighting apparatus, the control signal for one HID bulb is correctly set to the same duty ratio change pattern as that for the other HID bulbs in the control circuit 10.

Also, the HID bulb 7 is sometimes started at the cold start and is sometimes started at the hot start. Therefore, even though the HID bulb 7 is not changed to another, the electric characteristics of the HID bulb corresponding to the hot start differ from those corresponding to the cold start. However, the difference of the electric characteristics is small as compared with the difference between the typical electric characteristics shown in FIG. 2A and the typical electric characteristics shown in FIG. 2B. Therefore, the duty ratio change pattern of the control signal for one HID bulb 7 is not changed in the control circuit 10 regardless of the hot start or the cold start of the HID bulb 7.

In this embodiment, the control circuit is formed of a digital circuit such as a central processing unit. However, it is applicable that the control circuit be formed of an analog circuit.

Embodiment 2

Figure 3:
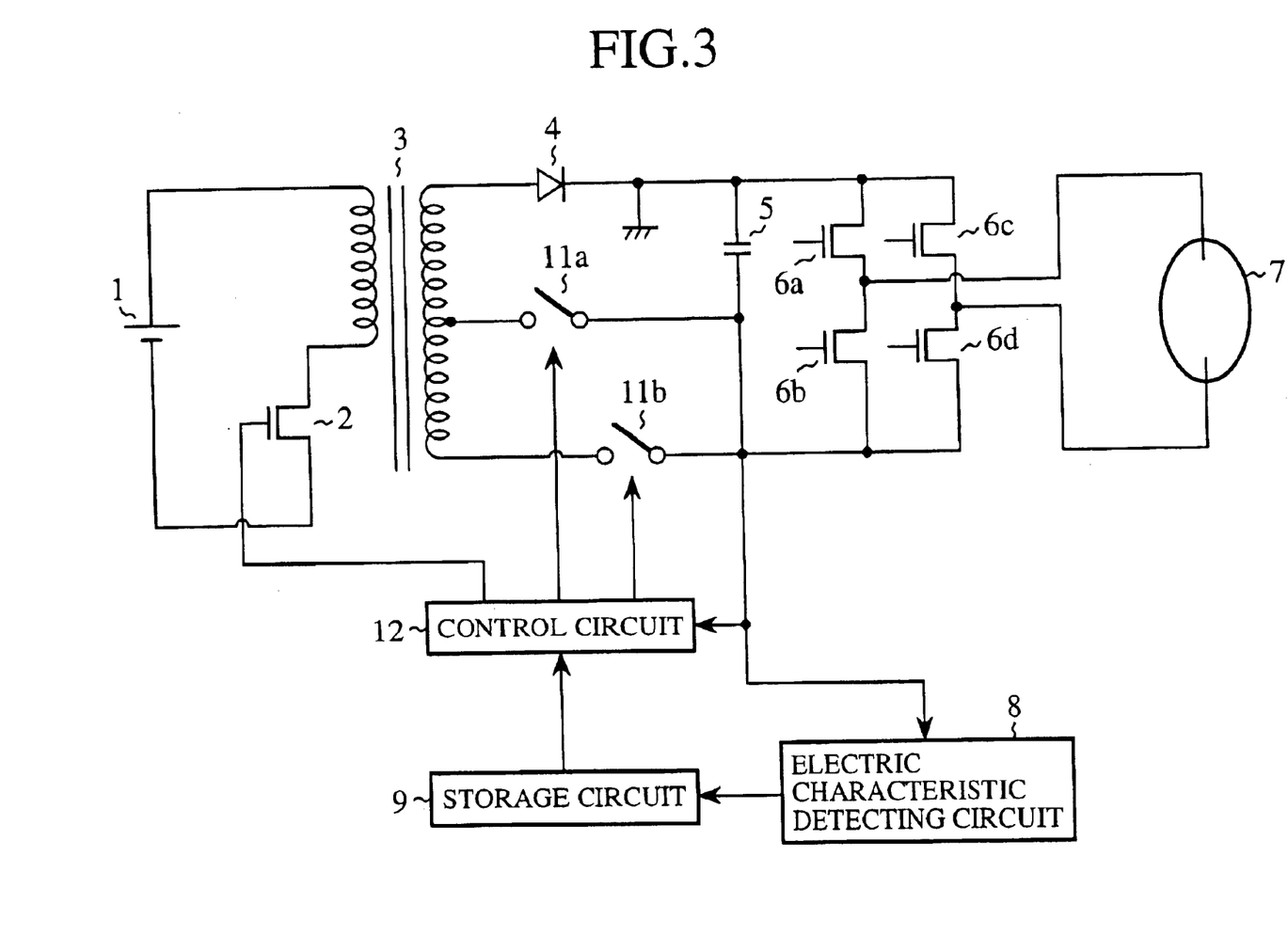
FIG. 3 is a circuit view showing a discharge lamp lighting apparatus according to a second embodiment of the present invention.

FIG. 3 is a circuit view showing a discharge lamp lighting apparatus according to a second embodiment of the present invention. The constituent elements, which are the same as those shown in FIG. 1, are indicated by the same reference numerals as those of the constituent elements shown in FIG. 1, and additional description of those constituent elements is omitted.

In FIG. 3, 11a indicates a switch (or winding number setting means) for selecting a shorter secondary winding of the transformer 3 under the control of a control circuit 12 to obtain a lower voltage from the transformer 3. 11b indicates a switch (or winding number setting means) for selecting a longer secondary winding of the transformer 3 under the control of the control circuit 12 to obtain a higher voltage from the transformer 3. The number of turns in the longer secondary winding is larger than that in the shorter secondary winding. 12 indicates the control circuit (or control means) for controlling the switches 11a and 11b at the start of the present lighting operation according to the change of the output voltage supplied to the HID bulb 7 in the preceding lighting operation to supply a voltage of a typical voltage characteristic appropriate to the type of the HID bulb 7 from the condenser 5 to the HID bulb 7 and outputting the control signal set to the appropriate duty ratio change pattern to the switching transistor 2 in the same manner as in the first embodiment.

Next, an operation of the discharge lamp lighting apparatus will be described below.

The bulb rated voltage of the D1/D2 bulb is equal to 85 V, and the bulb rated voltage of the D3/D4 bulb is equal to 42 V considerably different from 85 V. In a case where the number of turns in the secondary winding of the transformer 3 is too small to easily supply a high voltage to the HID bulb 7 formed of the D1 bulb or the D2 bulb, a flyback voltage of the primary winding of the transformer 3 is undesirably heightened. Therefore, it is required to heighten a withstand voltage of the switching transistor 2. Also, in a case where the number of turns in the secondary winding of the transformer 3 is too large to easily supply a low voltage to the HID bulb 7 formed of the D3 bulb or the D4 bulb, the impedance of the secondary winding is excessively high, it is difficult to output a flyback voltage from the secondary winding, and the voltage of the transformer 2 easily reaches a saturated voltage. Therefore, it is required to size up a core of the transformer 3.

Therefore, in a case where the voltage appropriate to the HID bulb 7 is high, it is required to increase the number of turns in the secondary winding of the transformer 3 and to heighten the impedance of the secondary winding. Also, in a case where the voltage appropriate to the HID bulb 7 is low, it is required to decrease the number of turns in the secondary winding of the transformer 3 and to lower the impedance of the secondary winding.

In the control circuit 12, the voltage characteristic of the detected electric characteristics of the preceding lighting operation stored in the storage circuit 9 is compared with that of the typical electric characteristics stored in the storage circuit 9. In a case where the voltage characteristic in the preceding lighting operation almost coincides with the typical voltage characteristic of the typical electric characteristics corresponding to the D1/D2 bulb shown in FIG. 2A, the switch 11a is set to the off state, and the switch 11b is set to the on state to supply a higher voltage to the HID bulb 7. Also, in a case where the voltage characteristic in the preceding lighting operation almost coincides with the typical voltage characteristic of the typical electric characteristics corresponding to the D3/D4 bulb shown in FIG. 2B, the switch 11b is set to the off state, and the switch 11a is set to the on state to supply a lower voltage to the HID bulb 7. Therefore, the voltage set to the typical voltage characteristic appropriate to the HID bulb 7 is applied to the HID bulb 7 in the time period from the start of the lighting operation to the stable lighting time in the present lighting operation regardless of whether the HID bulb 7 is formed of the D1/D2 bulb or the D3/D4 bulb.

As is described above, in the second embodiment, the impedance of the secondary winding of the transformer 3 is adjusted according to the voltage detected in the preceding lighting operation. In detail, in a case where the voltage applied to the HID bulb 7 in the preceding lighting operation is high, the number of turns in the secondary winding of the transformer 3 is increased to supply a higher voltage to the HID bulb 7. Also, in a case where the voltage applied to the HID bulb 7 in the preceding lighting operation is low, the number of turns in the secondary winding of the transformer 3 is decreased to supply a lower voltage to the HID bulb 7. Accordingly, it is not required to heighten the withstand voltage of the switching transistor 2, and the switching transistor 2 can be obtained at a low cost. Also, it is not required to size up a core of the transformer 3, and the transformer 3 can be obtained at a low cost.

Embodiment 3

Figure 4A:
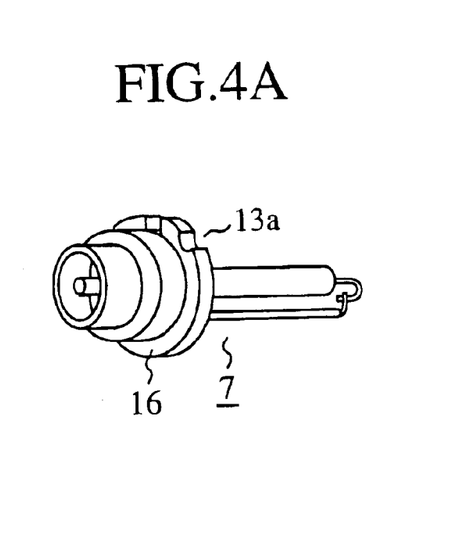
FIG. 4A is an oblique view of a D2 bulb representing a HID bulb.
Figure 4B:
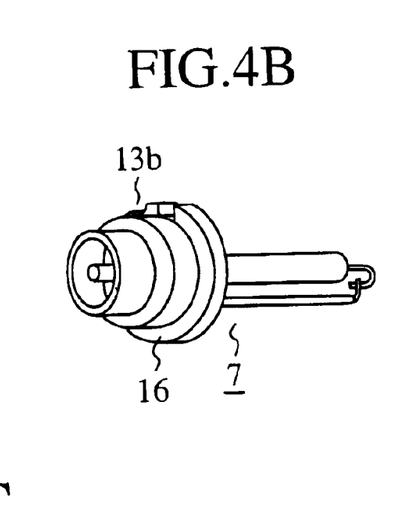
FIG. 4B is an oblique view of a D4 bulb representing a HID bulb.
Figure 4C:
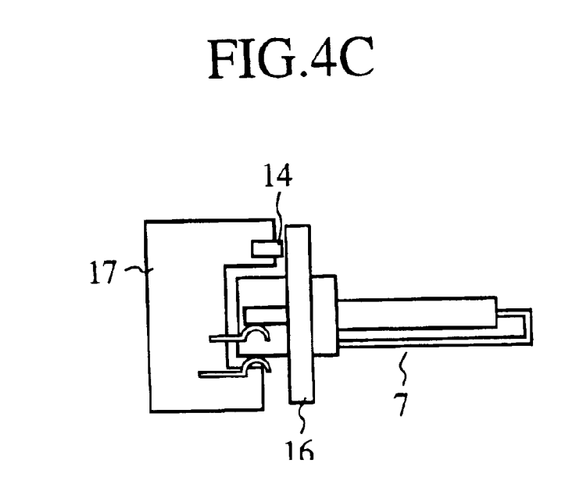
FIG. 4C is a schematic view of a HID bulb connected to a fitting unit.
Figure 5:
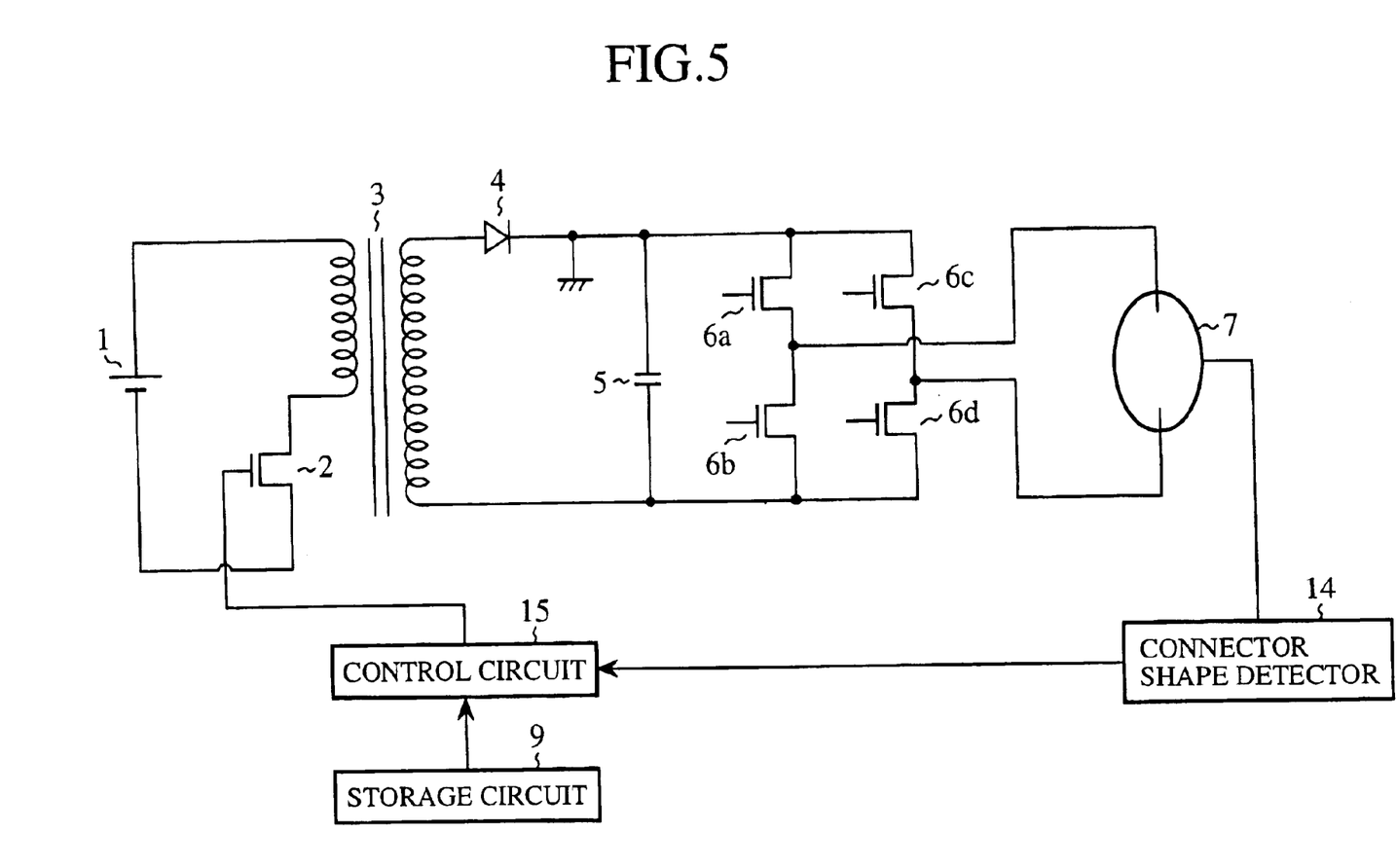
FIG. 5 is a circuit view showing a discharge lamp lighting apparatus according to a third embodiment of the present invention.

FIG. 4A is an oblique view of the D2 bulb representing the HID bulb 7, FIG. 4B is an oblique view of the D4 bulb representing the HID bulb 7, and FIG. 4C is a schematic view of the HID bulb 7 connected to a fitting unit. Also, FIG. 5 is a circuit view showing a discharge lamp lighting apparatus according to a third embodiment of the present invention. The constituent elements, which are the same as those shown in FIG. 1, are indicated by the same typical numerals as those of the constituent elements shown in FIG. 1, and additional description of those constituent elements is omitted.

In FIG. 4A, FIG. 4B, FIG. 4C and FIG. 5, 16 indicates a connector attached to the HID bulb 7. 13a indicates a notch placed in the connector 16 of the D2 bulb. 13b indicates a notch placed in the connector 16 of the D4 bulb. The position of the notch 13a in the connector 16 differs from that of the notch 13b. 17 indicates a fitting unit fitted to the connector 16 of the HID bulb 7. 14 indicates a connector shape detector (or shape detecting means) for detecting the notch 13a or 13b of the D2 bulb or the D4 bulb to detect a connector shape of the D2 bulb or the D4 bulb according to the detected notch 13a or 13b. 15 indicates a control circuit (or control means) for judging the type of the HID bulb 7 according to the connector shape of the D2 bulb or the D4 bulb detected in the connector shape detector 14 and controlling a duty ratio change pattern of a control signal sent to the switching transistor 2 so as to light the HID bulb 7 according to the typical electric characteristics appropriate to the judged type of the HID bulb 7.

In a first modification, the connector shape detector 14 comprises a first push button sticking out at the position of the notch 13a when the fitting unit 17 is fitted to the connector 16 having the notch 13a, a second push button sticking out at the position of the notch 13b when the fitting unit 17 is fitted to the connector 16 having the notch 13b, and a detecting unit for detecting the connector shape of the D2 bulb in a case where the second push button is pushed by the connector 16 and detecting the connector shape of the D4 bulb in a case where the first push button is pushed by the connector 16. In a case where the HID bulb 7 is formed of the D2 bulb, the first push button sticks out at the position of the notch 13a, and the second push button is pushed by the connector 16. Therefore, the connector shape of the D2 bulb can be detected according to the second push button pushed by the connector 16. Also, in a case where the HID bulb 7 is formed of the D4 bulb, the second push button sticks out at the position of the notch 13b, and the first push button is pushed by the connector 16. Therefore, the connector shape of the D4 bulb can be detected according to the first push button pushed by the connector 16.

In the first modification of the connector shape detector 14, it is applicable that the first push button or the second push button be not arranged in the connector shape detector 14. In case of no first push button, the connector shape of the D2 bulb can be detected according to the second push button pushed by the connector 16, and the connector shape of the D4 bulb can be detected according to the second push button not pushed by the connector 16. In case of no second push button, the connector shape of the D4 bulb can be detected according to the first push button pushed by the connector 16, and the connector shape of the D2 bulb can be detected according to the first push button not pushed by the connector 16.

In a second modification, the connector shape detector 14 comprises a metal projecting portion placed at the position of the notch 13a or 13b when the fitting unit 17 is fitted to the connector 16, a capacitance changing unit for changing a capacitance according to the position of the metal projecting portion, and a detecting unit for detecting the connector shape of the D2 bulb in a case where the capacitance of the capacitance changing unit indicates the metal projecting portion placed at the position of the notch 13a, and detecting the connector shape of the D4 bulb in a case where the capacitance indicates the metal projecting portion placed at the position of the notch 13b. Therefore, the connector shape of the D2 bulb or the D4 bulb can be detected according to a change of the capacitance.

In a third modification, the connector shape detector 14 comprises the metal projecting portion, an electric resistance changing unit for changing an electric resistance according to the position of the metal projecting portion, and a detecting unit for detecting the connector shape of the D2 bulb in a case where the electric resistance of the electric resistance changing unit indicates the metal projecting portion placed at the position of the notch 13a, and detecting the connector shape of the D4 bulb in a case where the electric resistance indicates the metal projecting portion placed at the position of the notch 13b. Therefore, the connector shape of the D2 bulb or the D4 bulb can be detected according to a change of the electric resistance.

In a fourth modification, the connector shape detector 14 comprises the metal projecting portion, an infrared ray intensity changing unit for changing the intensity of an infrared ray according to the position of the metal projecting portion, and a detecting unit for detecting the connector shape of the D2 bulb in a case where the intensity of the infrared ray in the infrared ray intensity changing unit indicates the metal projecting portion placed at the position of the notch 13a, and detecting the connector shape of the D4 bulb in a case where the intensity of the infrared ray indicates the metal projecting portion placed at the position of the notch 13b. Therefore, the connector shape of the D2 bulb or the D4 bulb can be detected according to a change of the intensity of the infrared ray.

Next, an operation of the discharge lamp lighting apparatus will be described below.

The connector shape detector 14 detects a connector shape of the D2 bulb or the D4 bulb at the start of the present lighting operation. In the control circuit 15, the type of the HID bulb 7 is judged according to the connector shape of the D2 bulb or the D4 bulb detected in the connector shape detector 14, and a duty ratio of a control signal sent to the switching transistor 2 is set to a prescribed duty ratio change pattern so as to light the HID bulb 7 according to the electric power of the typical electric characteristics which are stored in the storage circuit 9 and are appropriate to the judged type of the HID bulb 7. Foe example, in a case where the connector shape of the D2 bulb is detected in the connector shape detector 14, the control circuit 15 judges that the D2 bulb is connected to the discharge lamp lighting apparatus, and the control signal is set to the lower duty ratio change pattern. Also, in a case where the connector shape of the D4 bulb is detected in the connector shape detector 14, the control circuit 15 judges that the D4 bulb is connected to the discharge lamp lighting apparatus, and the control signal is set to the higher duty ratio change pattern.

As is described above, in the third embodiment, in a case where the HID bulb 7 formed of the D2 bulb is connected to the discharge lamp lighting apparatus, the connector shape of the D2 bulb is detected at the start of the present lighting operation, and the type of the HID bulb 7 can be judged to be the D2 bulb. Also, in a case where the HID bulb 7 formed of the D4 bulb is connected to the discharge lamp lighting apparatus, the connector shape of the D4 bulb is detected at the start of the present lighting operation, and the type of the HID bulb 7 can be judged to be the D4 bulb. Accordingly, even though the HID bulb is replaced with another HIV bulb of the different type, the electric power supplied from the condenser 5 to the HID bulb can be controlled by the discharge lamp lighting apparatus so as to output the electric power of the typical electric characteristics appropriate to the type of the HID bulb, and the HID bulb can be efficiently lighted from the start of the present lighting operation.

In the third embodiment, the connector shape is detected. However, it is applicable that a shape of the bulb or a shape of the terminals of the bulb be detected in place of the connector shape.

Also, in the first to third embodiments, the D1 bulb, the D2 bulb, the D3 bulb and the D4 bulb represent the HID bulb 7. However, the present invention is not limited to those bulbs, and it is applicable that other types of bulbs be used as the HID bulb 7.

What is claimed is:

1. A discharge lamp lighting apparatus comprising:

discharge lamp lighting means for producing an electric power and supplying the electric power to a discharge lamp to light the discharge lamp;

electric characteristic detecting means for detecting an electric characteristic of the electric power supplied to the discharge lamp by the discharge lamp lighting means in a preceding lighting operation;

storing means for storing the electric characteristic of the preceding lighting operation detected by the electric characteristic detecting means; and control means for judging a type of the discharge lamp according to the detected electric characteristic of the preceding lighting operation stored by the storing means and controlling the discharge lamp lighting means to produce a typical electric power of a typical electric characteristic appropriate to the judged type of the discharge lamp and to light the discharge lamp according to the typical electric power of the typical electric characteristic.

2. The discharge lamp lighting apparatus according to claim 1, wherein the discharge lamp lighting means comprises:

rectangular-shaped current producing means for producing a rectangular-shaped current according to a control signal set to a duty ratio; and power supplying means for producing the electric power from the rectangular-shaped current produced by the rectangular-shaped current producing means and supplying the electric power to the discharge lamp, and the control means controls the duty ratio of the control signal supplied to the rectangular-shaped current producing means to produce the typical electric power of the typical electric characteristic in the power supplying means.

3. The discharge lamp lighting apparatus according to claim 2, wherein the power supplying means comprises:

a transformer, having a primary winding and a secondary winding, for heightening a voltage of the rectangular-shaped current produced by the rectangular-shaped current producing means; and winding number setting means for setting the number of turns of the secondary winding in the transformer, and the control means controls the winding number setting means to set the number of turns of the secondary winding in the transformer to a specific number of turns at which the transformer produces a specific voltage coincident with an output voltage indicated by the detected electric characteristic of the preceding lighting operation stored by the storing means.

4. The discharge lamp lighting apparatus according to claim 1, wherein one typical electric characteristic appropriate to one discharge lamp type is stored by the storing means for each of a plurality of discharge lamp types, and the control means judges the discharge lamp to be a specific type in a case where the detected electric characteristic of the preceding lighting operation stored by the storing means coincides with the typical electric characteristic which is stored by the storing means and is appropriate to the specific type of the discharge lamp.

5. The discharge lamp lighting apparatus according to claim 1, wherein a change of the electric power supplied by the discharge lamp lighting means to the discharge lamp, a change of a voltage of the electric power or a change of a current of the electric power in a time period from a lighting start time to a stable lighting time of the discharge lamp is detected by the electric characteristic detecting means as the electric characteristic of the electric power.

6. The discharge lamp lighting apparatus according to claim 1, wherein an output voltage of the electric power supplied by the discharge lamp lighting means to the discharge lamp at a stable lighting time of the discharge lamp is detected by the electric characteristic detecting means, the type of the discharge lamp is judged by the control means according to the output voltage of the stable lighting time of the preceding lighting operation of the discharge lamp stored by the storing means, and the control means controls the discharge lamp lighting means to produce the typical electric power of the typical electric characteristic appropriate to the judged type of the discharge lamp and to light the discharge lamp according to the typical electric power of the typical electric characteristic.

7. The discharge lamp lighting apparatus according to claim 1, wherein a voltage increasing characteristic of the electric power supplied by the discharge lamp lighting means to the discharge lamp at a lighting start time of the discharge lamp is detected by the electric characteristic detecting means, the type of the discharge lamp is judged by the control means according to the voltage increasing characteristic of the lighting start time of the preceding lighting operation of the discharge lamp stored by the storing means, and the control means controls the discharge lamp lighting means to produce the typical electric power of the typical electric characteristic appropriate to the judged type of the discharge lamp and to light the discharge lamp according to the typical electric power of the typical electric characteristic.

8. The discharge lamp lighting apparatus according to claim 1, wherein the storing means is formed of a random access memory to which power is always supplied.

9. The discharge lamp lighting apparatus according to claim 1, wherein the storing means is formed of an electrically erasable/programmable read only memory.

10. The discharge lamp lighting apparatus according to claim 1, wherein the control means judges that the discharge lamp is lighted for the first time in a case where no detected electric characteristic of the preceding lighting operation is stored by the storing means, and the control means controls the discharge lamp lighting means to produce a specific electric power set to a specific electric characteristic appropriate to a type of the discharge lamp, in which a consumed electric power is lowest among those of a plurality of types of discharge lamps, and to light the discharge lamp according to the specific electric power of the specific electric characteristic.

11. The discharge lamp lighting apparatus according to claim 1, wherein the control means is formed of a digital circuit.

12. The discharge lamp lighting apparatus according to claim 1, wherein the control means is formed of an analog circuit.

* * * * *